(12) United States Patent
Xie et al.

(10) Patent No.: US 8,937,359 B2
(45) Date of Patent: Jan. 20, 2015

(54) CONTACT FORMATION FOR ULTRA-SCALED DEVICES

(71) Applicants: GLOBALFOUNDRIES Inc., Grand Cayman, KY (US); International Business Machines Corporation, Armonk, NY (US)

(72) Inventors: Ruilong Xie, Niskayuna, NY (US); Shom Ponoth, Gaithersburg, MD (US); David V. Horak, Essex Junction, NY (US); Balasubramanian Pranatharthiharan, Latham, NY (US)

(73) Assignees: GLOBALFOUNDRIES Inc., Grand Cayman (KY); International Business Machines Corporation, Armonk, NY (US)

( * ) Notice: Subject to any disclaimer, the term of this patent is extended or adjusted under 35 U.S.C. 154(b) by 51 days.

(21) Appl. No.: 13/894,513

(22) Filed: May 15, 2013

(65) Prior Publication Data
US 2014/0339629 A1 Nov. 20, 2014

(51) Int. Cl.
H01L 27/088 (2006.01)
H01L 29/78 (2006.01)
H01L 29/66 (2006.01)

(52) U.S. Cl.
CPC ...... H01L 29/7827 (2013.01); H01L 29/66666 (2013.01)
USPC ................ 257/401; 257/E29.052; 438/284; 438/299

(58) Field of Classification Search
USPC .......... 257/382, 401, E29.052; 438/284, 299
See application file for complete search history.

(56) References Cited

U.S. PATENT DOCUMENTS

| 6,888,187 | B2 | 5/2005 | Brown et al. | |
| 7,341,916 | B2 | 3/2008 | Lojek | |
| 8,679,968 | B2 * | 3/2014 | Xie et al. | 438/639 |
| 2012/0129301 | A1 | 5/2012 | Or-Bach et al. | |
| 2014/0138779 | A1 * | 5/2014 | Xie et al. | 257/401 |

* cited by examiner

Primary Examiner — Minh-Loan Tran
(74) Attorney, Agent, or Firm — Williams Morgan, P.C.

(57) ABSTRACT

Embodiments of the invention provide approaches for forming gate and source/drain (S/D) contacts. Specifically, the semiconductor device includes a gate transistor formed over a substrate, a S/D contact formed over a trench-silicide (TS) layer and positioned adjacent the gate transistor, and a gate contact formed over the gate transistor, wherein at least a portion of the gate contact is aligned over the TS layer. This structure enables contact with the TS layer, thereby decreasing the distance between the gate contact and the source/drain, which is desirable for ultra-area-scaling.

20 Claims, 16 Drawing Sheets

CONTACT FORMATION FOR ULTRA-SCALED DEVICES

BACKGROUND

1. Technical Field

This invention relates generally to the field of semiconductors, and more particularly, to approaches used in forming contacts for ultra-scaled semiconductor devices.

2. Related Art

A typical integrated circuit (IC) chip includes a stack of several levels or sequentially formed layers of shapes. Each layer is stacked or overlaid on a prior layer and patterned to form the shapes that define devices (e.g., fin field effect transistors (FINFETs)) and connect the devices into circuits. In a typical state of the art complementary insulated gate FINFET process, such as what is normally referred to as CMOS, layers are formed on a wafer to form the devices on a surface of the wafer. Further, the surface may be the surface of a silicon layer on a silicon on insulator (SOI) wafer. A simple FINFET is formed by the intersection of two shapes, i.e., a gate layer rectangle on a silicon island formed from the silicon surface layer. Each of these layers of shapes, also known as mask levels or layers, may be created or printed optically through well known photolithographic masking, developing and level definition, e.g., etching, implanting, deposition and etc.

For FINFET devices, it is desirable to have a source/drain contact strap over an active region (Rx) to make sure all FINs are connected by contact. For example, as shown in the exemplary current art device 10 of FIG. 1, TS 12 straps over each FIN 14A-N to make sure even at a worst condition of misalignment, TS 12 will still provide adequate coverage. To avoid a gate contact (CB) 18 to TS 12 short due to insufficient distance D2 with a worst-case misalignment, current art device 10 has to position CB 18 of gate 20 a long distance D1 away from Rx 16. Although this prevents the CB to TS short, it is not desirable for circuit area scaling. Therefore, what is needed is a solution to at least this deficiency of the prior art.

SUMMARY

In general, embodiments herein provide approaches for gate and source/drain contact formation in a semiconductor device. Specifically, the semiconductor device includes a gate transistor formed over a substrate, a source/drain (S/D) contact formed over a trench-silicide (TS) layer and positioned adjacent the gate transistor, and a gate contact formed over the gate transistor, wherein at least a portion of the gate contact is aligned over the TS layer. This structure enables contact with the TS layer, thereby decreasing the distance between the gate contact and the source/drain, which is desirable for ultra-area-scaling.

One aspect of the present invention includes a method for forming a device, the method comprising: forming a gate transistor over a substrate; forming a source/drain (S/D) contact over a trench-silicide (TS) layer formed adjacent the gate transistor; and forming a gate contact over the gate transistor, wherein at least a portion of the gate contact is positioned over the TS layer.

Another aspect of the present invention includes a method of forming contacts in a semiconductor device, the method comprising: forming a source/drain (S/D) contact over a trench-silicide (TS) layer formed adjacent the gate transistor; and forming a gate contact over the gate transistor, wherein at least a portion of the gate contact is aligned over the TS layer.

Another aspect of the present invention includes a semiconductor comprising: a replacement metal gate (RMG) transistor formed over a substrate; a source/drain (S/D) contact formed over a trench-silicide (TS) layer and positioned adjacent the gate transistor; and a gate contact formed over the RMG transistor, wherein at least a portion of the gate contact is vertically aligned over the TS layer.

BRIEF DESCRIPTION OF THE DRAWINGS

These and other features of this invention will be more readily understood from the following detailed description of the various aspects of the invention taken in conjunction with the accompanying drawings in which.

Figure 1:
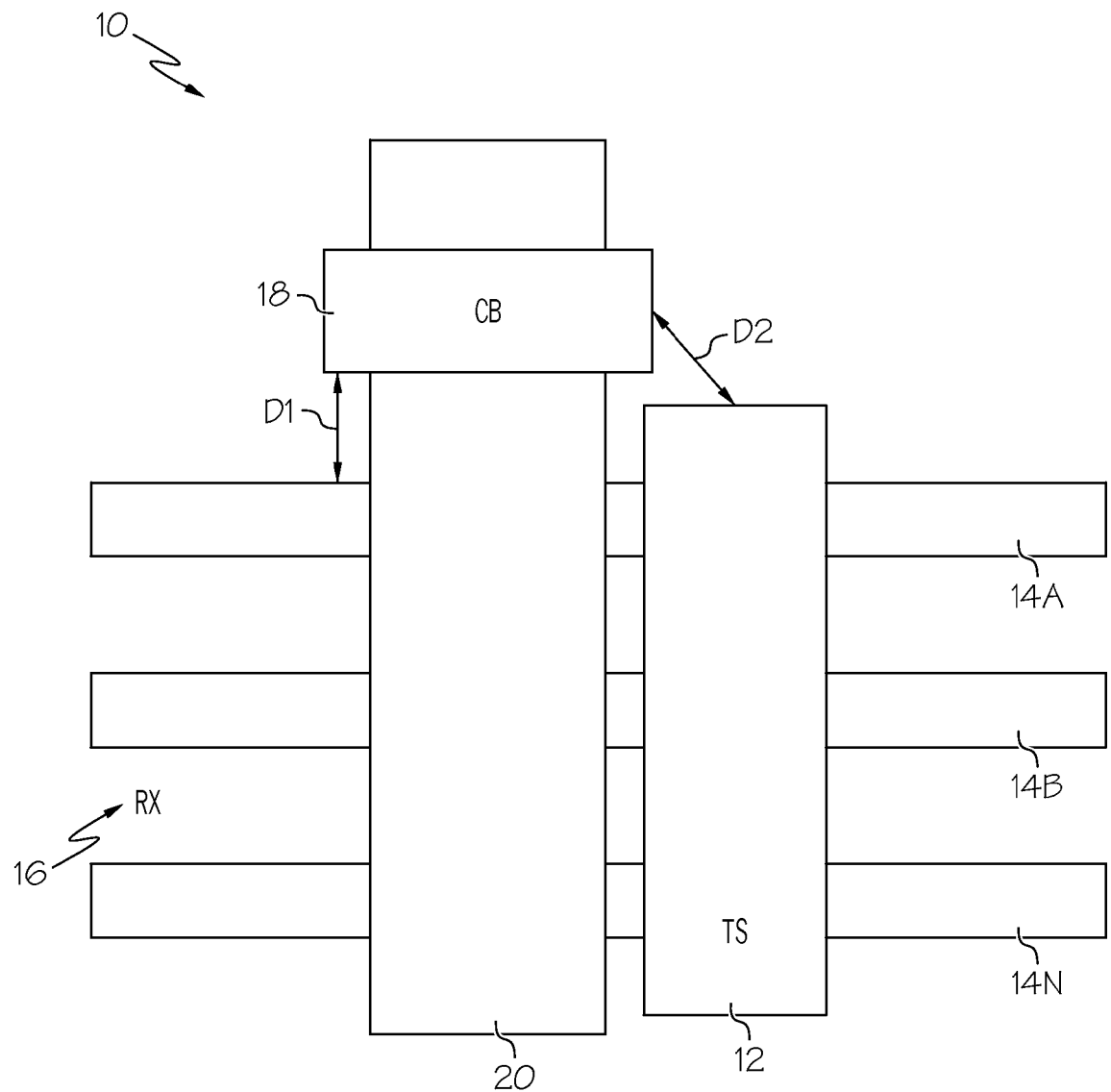
FIG. 1 shows a top-view of a prior art semiconductor device.

The drawings are not necessarily to scale. The drawings are merely representations, not intended to portray specific parameters of the invention. The drawings are intended to depict only typical embodiments of the invention, and therefore should not be considered as limiting in scope. In the drawings, like numbering represents like elements.

DETAILED DESCRIPTION

Exemplary embodiments will now be described more fully herein with reference to the accompanying drawings, in which exemplary embodiments are shown. Described are approaches for forming gate and S/D contacts for ultra-scaled devices. Specifically, the semiconductor device includes a gate transistor formed over a substrate, a source/drain (S/D) contact formed over a trench-silicide (TS) layer and positioned adjacent the gate transistor, and a gate contact formed over the gate transistor, wherein at least a portion of the gate contact is aligned over the TS layer. This structure enables contact with the TS layer, thereby decreasing the distance between the gate contact and the source/drain, which is desirable for ultra-area-scaling.

It will be appreciated that this disclosure may be embodied in many different forms and should not be construed as limited to the exemplary embodiments set forth herein. Rather, these exemplary embodiments are provided so that this disclosure will be thorough and complete and will fully convey the scope of this disclosure to those skilled in the art. The terminology used herein is for the purpose of describing particular embodiments only and is not intended to be limiting of this disclosure. For example, as used herein, the singular forms "a", "an", and "the" are intended to include the plural forms as well, unless the context clearly indicates otherwise. Furthermore, the use of the terms "a", "an", etc., do not denote a limitation of quantity, but rather denote the presence of at least one of the referenced items. It will be further understood that the terms "comprises" and/or "comprising", or "includes" and/or "including", when used in this specification, specify the presence of stated features, regions, integers, steps, operations, elements, and/or components, but do not preclude the presence or addition of one or more other features, regions, integers, steps, operations, elements, components, and/or groups thereof.

Reference throughout this specification to "one embodiment," "an embodiment," "embodiments," "exemplary embodiments," or similar language means that a particular feature, structure, or characteristic described in connection with the embodiment is included in at least one embodiment of the present invention. Thus, appearances of the phrases "in one embodiment," "in an embodiment," "in embodiments" and similar language throughout this specification may, but do not necessarily, all refer to the same embodiment.

The terms "overlying" or "atop", "positioned on" or "positioned atop", "underlying", "beneath" or "below" mean that a first element, such as a first structure, e.g., a first layer, is present on a second element, such as a second structure, e.g. a second layer, wherein intervening elements, such as an interface structure, e.g. interface layer, may be present between the first element and the second element.

As used herein, "depositing" may include any now known or later developed techniques appropriate for the material to be deposited including but not limited to, for example: chemical vapor deposition (CVD), low-pressure CVD (LPCVD), plasma-enhanced CVD (PECVD), semi-atmosphere CVD (SACVD) and high density plasma CVD (HDPCVD), rapid thermal CVD (RTCVD), ultra-high vacuum CVD (UH-VCVD), limited reaction processing CVD (LRPCVD), metal-organic CVD (MOCVD), sputtering deposition, ion beam deposition, electron beam deposition, laser assisted deposition, thermal oxidation, thermal nitridation, spin-on methods, physical vapor deposition (PVD), atomic layer deposition (ALD), chemical oxidation, molecular beam epitaxy (MBE), plating, evaporation.

Figure 2A:
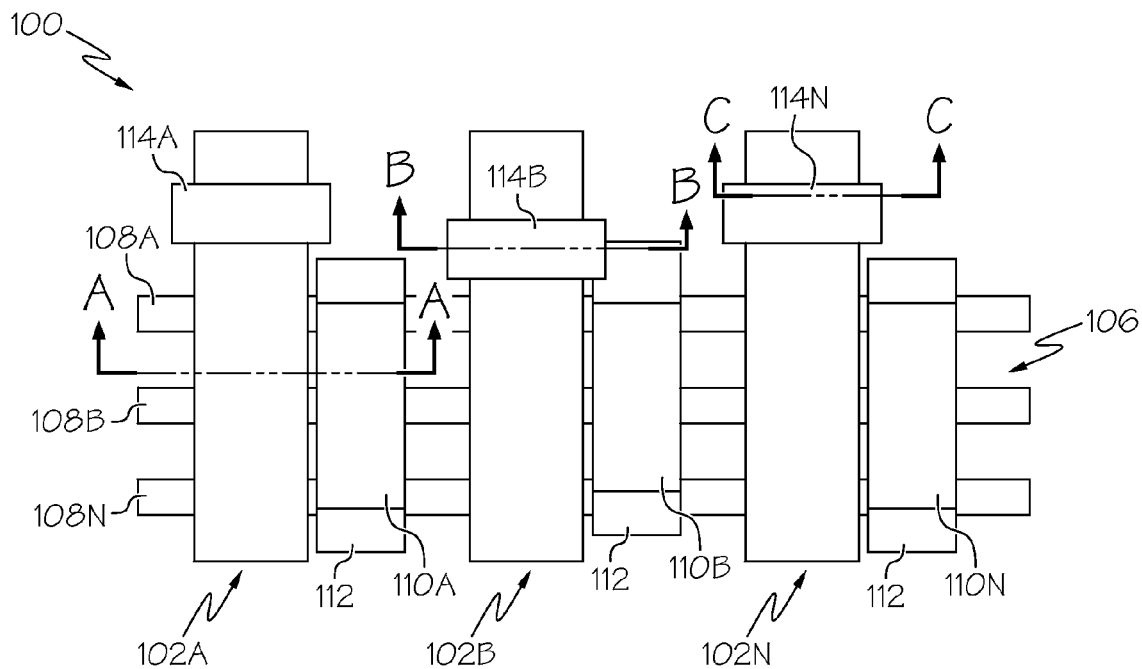
FIG. 2A shows a top view of a semiconductor according to illustrative embodiments.

With reference again to the figures, FIG. 2A shows a top view of a device 100 according to one embodiment. Device 100 comprises a layered integrated circuit (IC) structure including a set of gate transistors 102A-N formed over an active region 106 having a plurality of fins 108A-N. A set of source/drain (S/D) contacts 110A-N is shown formed over a trench-silicide (TS) layer 112 and positioned adjacent gate transistors 102A-N, and a set of gate contacts 114A-N is shown formed over each respective gate transistor 102A-N. As shown, at least a portion of gate contact 114B is aligned over TS layer 112. This configuration enables contact with TS layer 112, thereby decreasing the distance between gate contact 114B and the source/drain, which is desirable for ultra-area-scaling. Also shown is cut line A-A, which is a cut inside active region 106 and through S/D contact 110A, cut line B-B, which is a cut through gate contact 114B and S/D contact 110B, and cut line C-C, which is a cut through gate contact 114N.

Figure 2B:
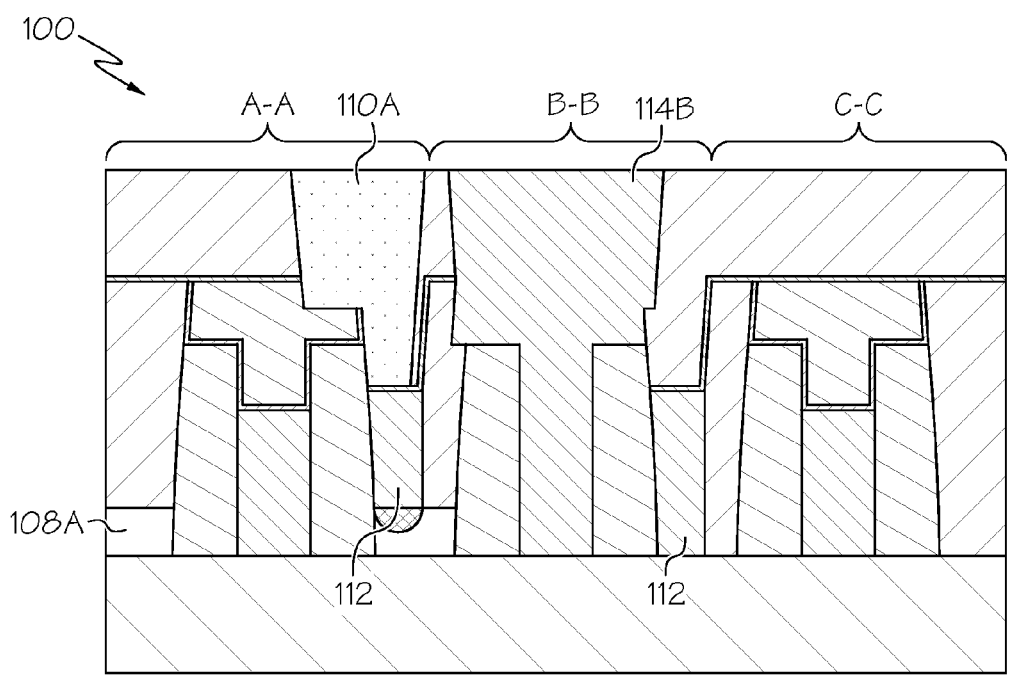
FIG. 2B shows a side cross-sectional view of the semiconductor device of FIG. 2A according to illustrative embodiments.
Figure 2C:
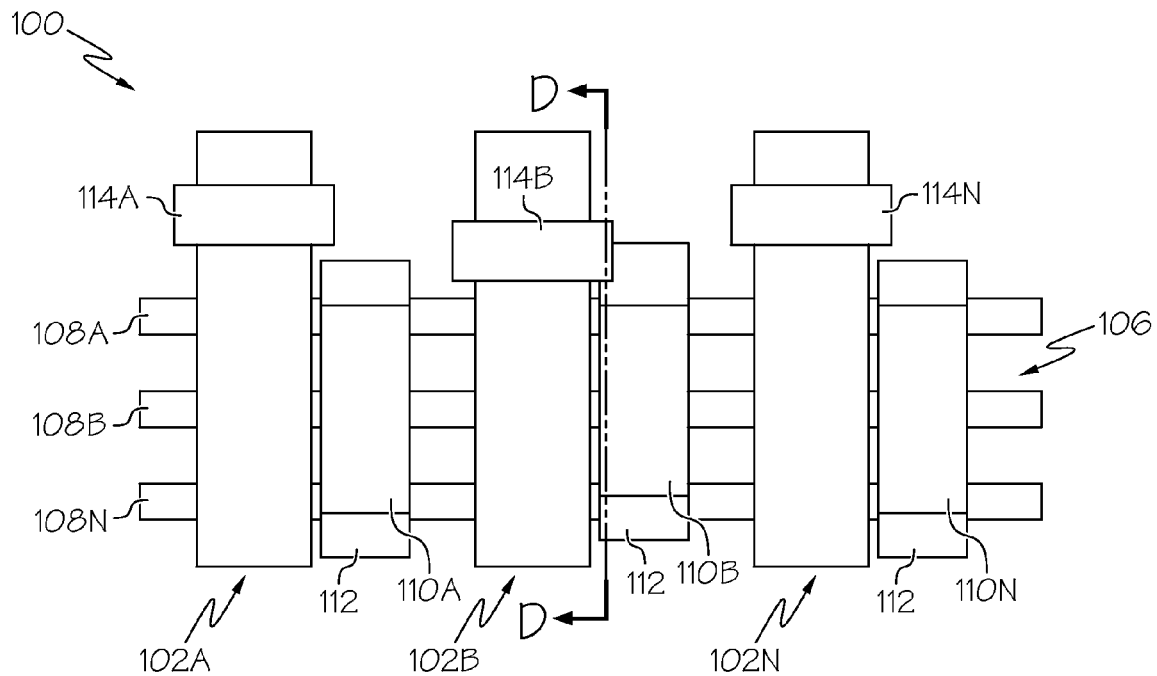
FIG. 2C shows a top view of the semiconductor according to illustrative embodiments.
Figure 2D:
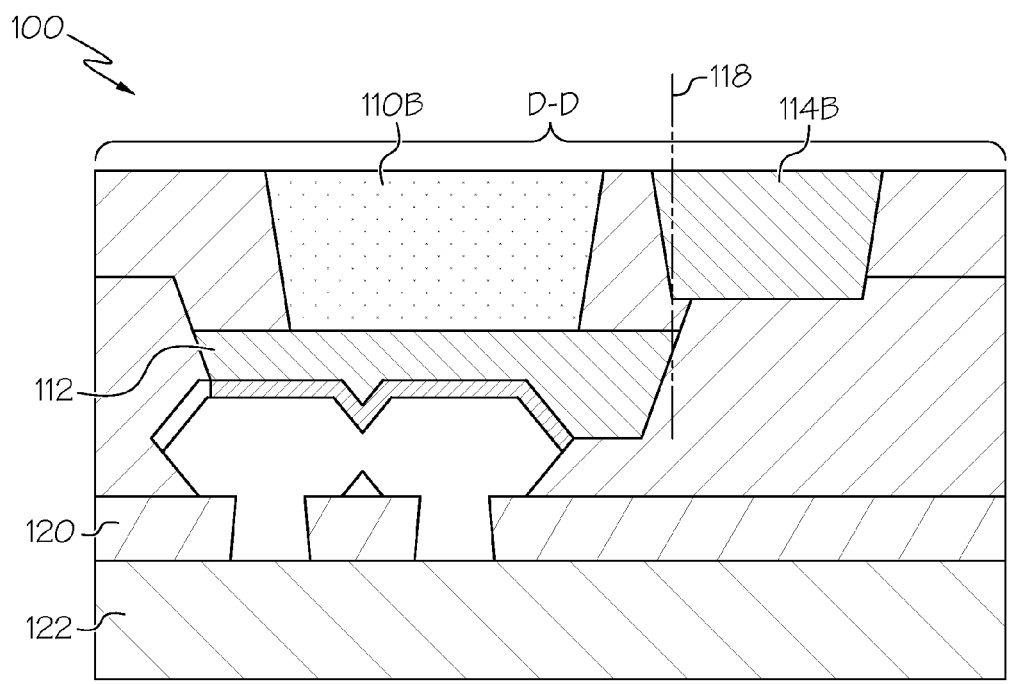
FIG. 2D shows a side cross-sectional view of the semiconductor device of FIG. 2C according to illustrative embodiments.

FIG. 2B shows device 100 along each respective cut line A-A, B-B and C-C, and will be explained in further detail below with reference to FIGS. 4-15. FIG. 2C shows a top view of device 100 having cut line D-D, while FIG. 2D shows that at least a portion of gate contact 114B is vertically aligned over TS layer 112 (demonstrated by dashed line 118). Here, TS layer 112 is shown recessed beneath a bottom surface of S/D contact 110B. This structure of device 100 enables contact with TS layer 112, thereby decreasing the distance between gate contact 114B and the source/drain. Also shown is a source trench isolation (STI) layer 120 over a substrate 122.

Figure 3A:
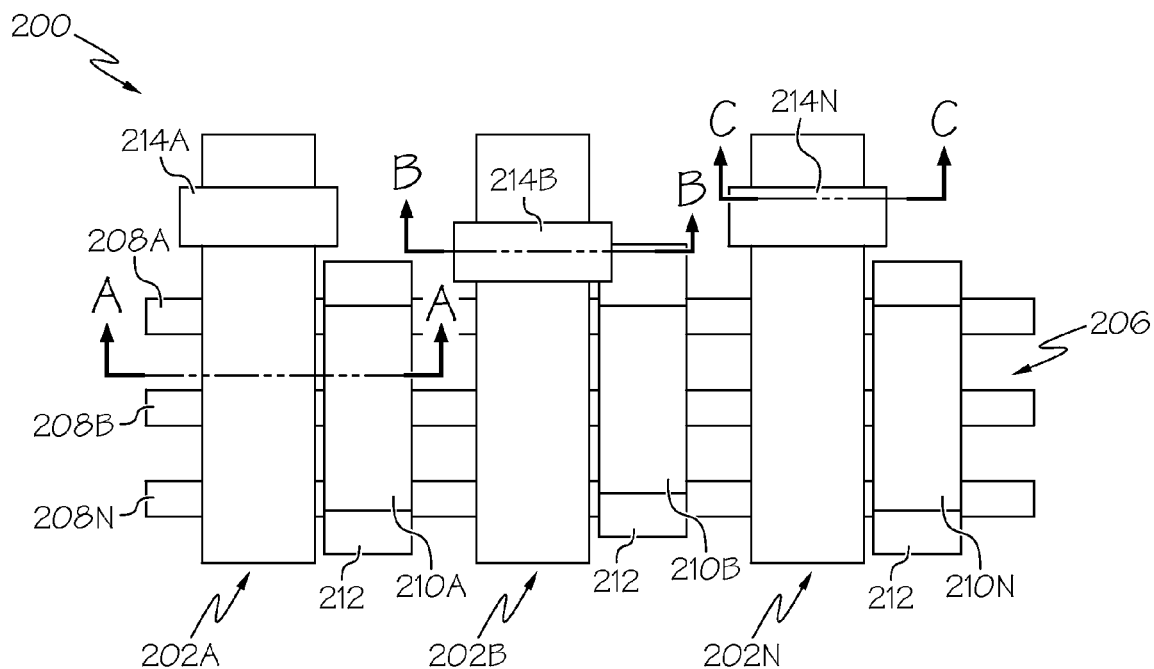
FIG. 3A shows a top view of a semiconductor according to illustrative embodiments.

FIG. 3A shows a top view of a device 200 according to another embodiment. Device 200 comprises a layered integrated circuit (IC) structure including a set of gate transistors 202A-N formed over an active region 206 having a plurality of fins 208A-N. S/D contacts 210A-N are shown formed over TS layer 212 and positioned adjacent gate transistors 202A-N. Gate contacts 214A-N are shown formed over each respective gate transistor 202A-N. As shown, at least a portion of gate contact 214B is aligned over TS layer 212. This configuration enables contact with TS layer 212, thereby decreasing the distance between gate contact 214B and the source/drain, which is desirable for ultra-area-scaling. Also shown is cut line A-A, which is a cut inside active region 206 and through S/D contact 210A, cut line B-B, which is a cut through gate contact 214B and S/D contact 210B, and cut line C-C, which is a cut through gate contact 214N.

Figure 3B:
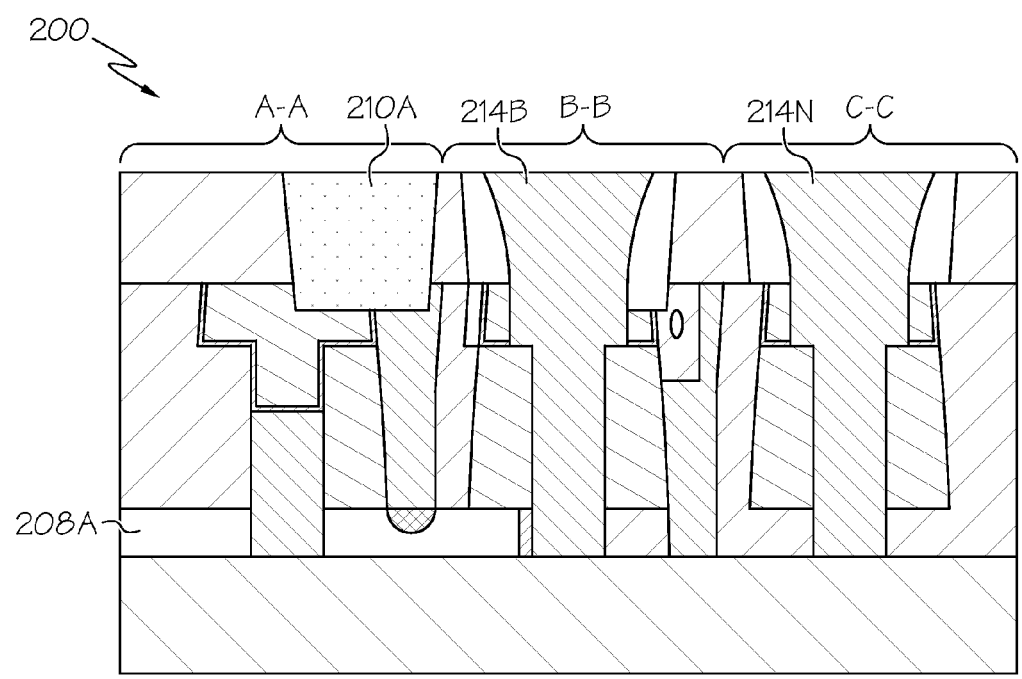
FIG. 3B shows a side cross-sectional view of the semiconductor device of FIG. 3A according to illustrative embodiments.
Figure 3C:
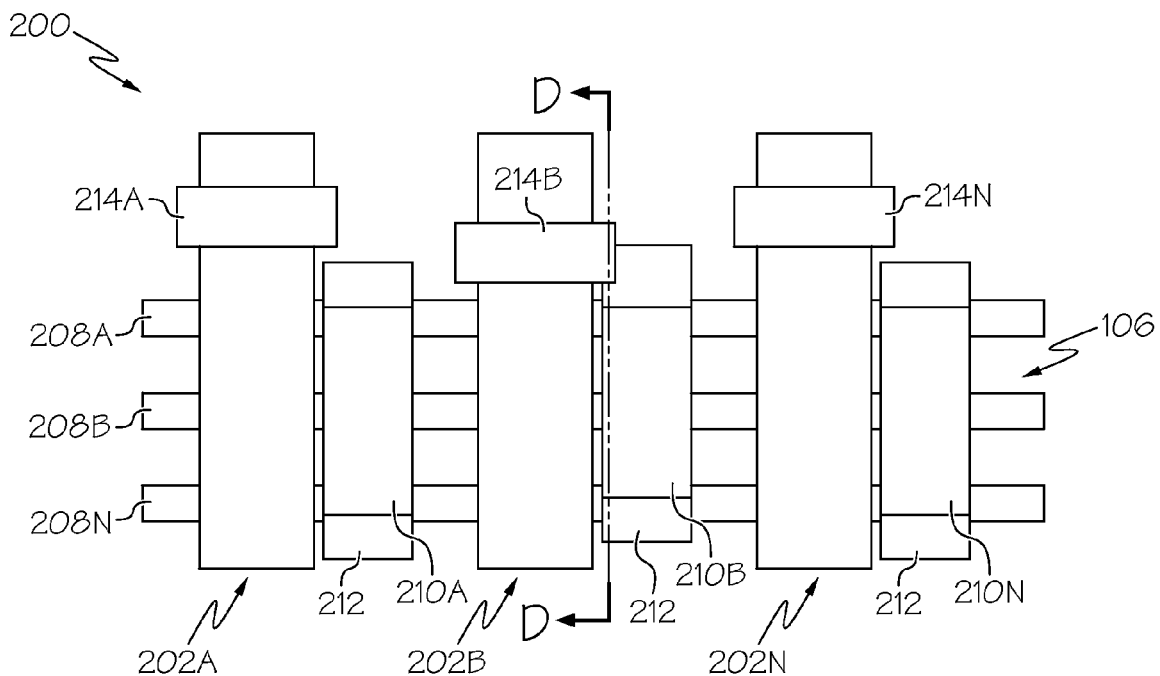
FIG. 3C shows a top view of the semiconductor according to illustrative embodiments.
Figure 3D:
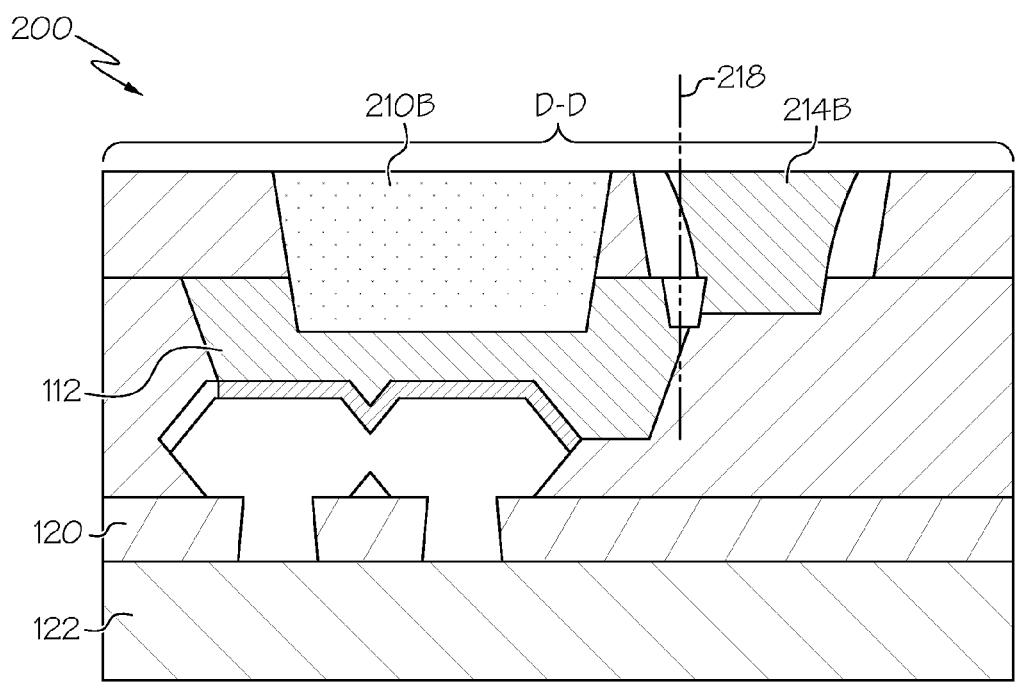
FIG. 3D shows a side cross-sectional view of the semiconductor device of FIG. 3C according to illustrative embodiments.

FIG. 3B shows device 200 along each respective cut line A-A, B-B and C-C, and will be explained in further detail below with reference to FIGS. 16-25. FIG. 3C shows a top view of device 200 having cut line D-D, while FIG. 3D shows that at least a portion of gate contact 214B is vertically aligned over TS layer 212 (demonstrated by dashed line 218). Here, TS layer 212 is shown partially recessed beneath a bottom surface of S/D contact 210B. Furthermore, TS layer 212 is partially recessed beneath the portion of gate contact 214B vertically aligned over TS layer 212. This structure of device 200 enables contact with TS layer 212, thereby decreasing the distance between gate contact 214B and the source/drain.

Figure 4:
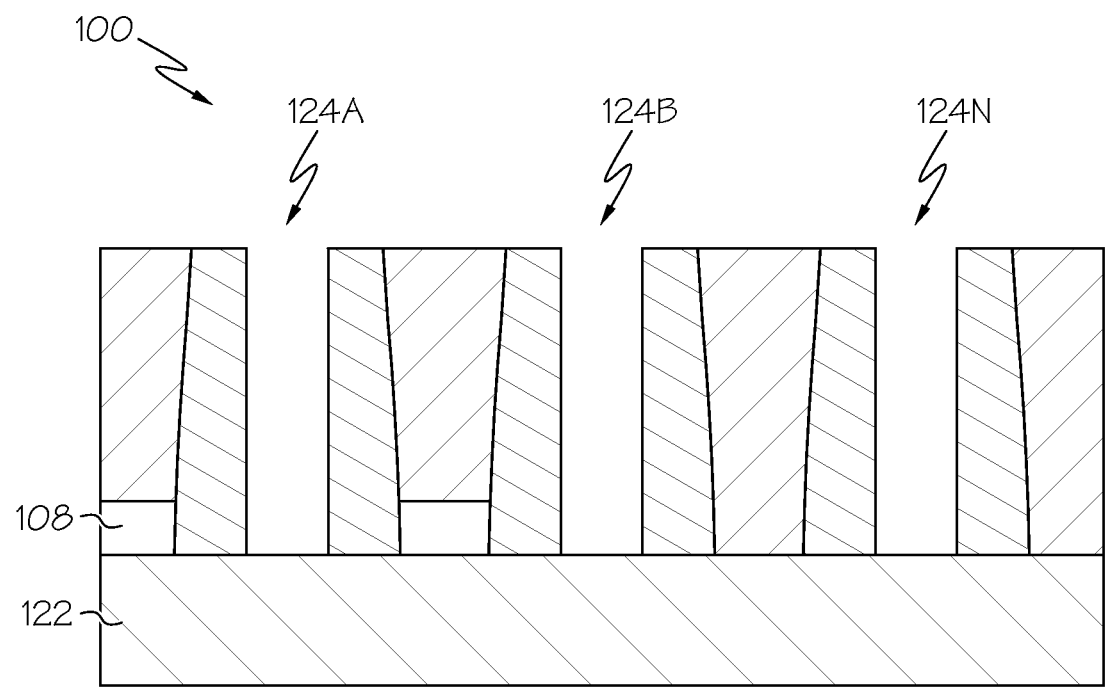
FIG. 4 shows a side cross-sectional view of the semiconductor device of following a gate open process according to illustrative embodiments.
Figure 5:
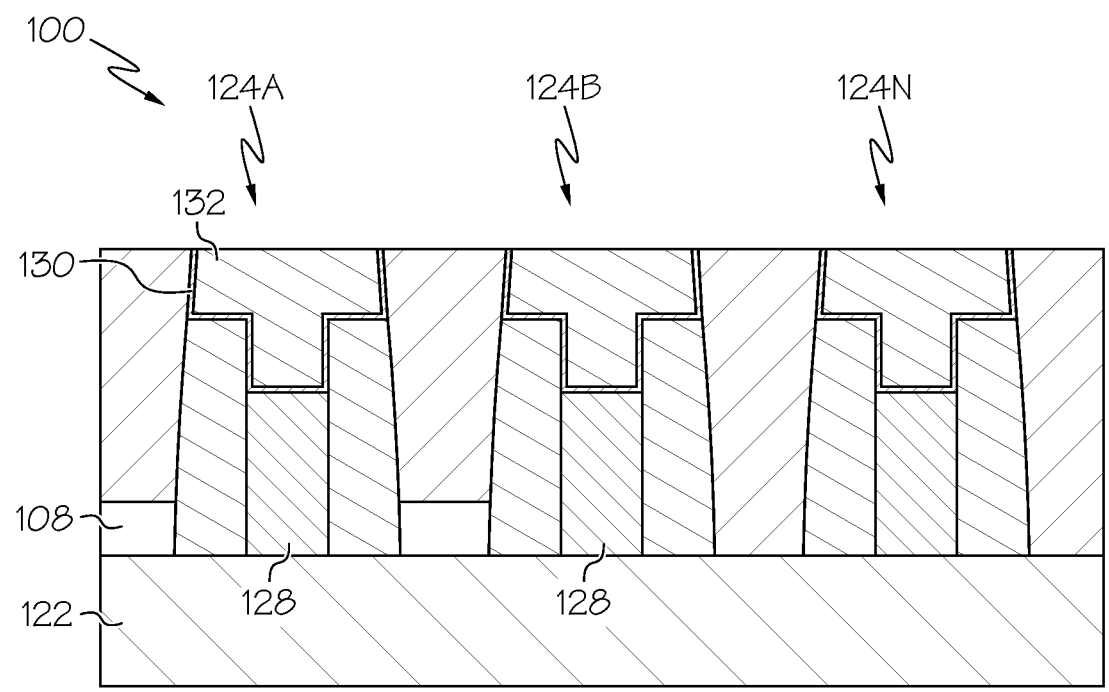
FIG. 5 shows a side cross-sectional view of the semiconductor device following gate recess formation and a capping layer deposition according to illustrative embodiments.

Referring now to FIGS. 4-15, a process for forming contacts in device 100 (FIGS. 2A-D) according to a first embodiment will be described. As shown in the side cross-sectional view of FIG. 4, device 100 includes a set of gate structures 124A-N (e.g., replacement metal gate structures) formed over substrate 122, which may have a planer or FIN structure. It will be appreciated that gate structure 124A is from cut A-A, gate structure 124B is from cut B-B, and gate structure 124N is from cut C-C, as shown in FIGS. 2A-2B. Gate structures 124A-N are opened, as shown in FIG. 4, and then filled with a recessed gate dielectric and metal stack 128 (e.g., HfO2 as gate dielectric, TiN and Was gate metal), a spacer protection layer 130 (e.g., HfO2), and a capping layer 132 (e.g., SiN), as shown in FIG. 5. Capping layer 132 is formed by depositing SiN followed by chemical mechanical planarization (CMP). As understood to those skilled in the art, the CMP process involves contacting a material layer to be polished with a rotating polishing pad. An abrasive slurry comprising an abrasive suspended in an aqueous solution, which may also contain chemical constituents to achieve selectively, is disposed between the polishing pad and the material layer to be polished. The material layer to be polished is then polished away with the polish pad and slurry to achieve a desired removal.

Substrate 122 may be any silicon containing substrate including, but not limited to Si, bulk Si, single crystal Si, polycrystalline Si, SiGe, amorphous Si, silicon-on-insulator substrates (SOI), SiGe-on-insulator (SGOI), strained-silicon-on-insulator, annealed poly Si, and poly Si line structures. In one embodiment, when substrate 122 is a silicon-on-insulator (SOI) or SiGe-on-insulator (SGOI) substrate, the thickness of the semiconducting Si-containing layer atop the buried insulating layer (not shown) may be 10 nm or greater. In one embodiment, the SOI or SGOI substrate may be fabricated using a thermal bonding process, or alternatively be fabricated by an ion implantation process, such as separation by ion implantation of oxygen (SIMOX).

Figure 6:
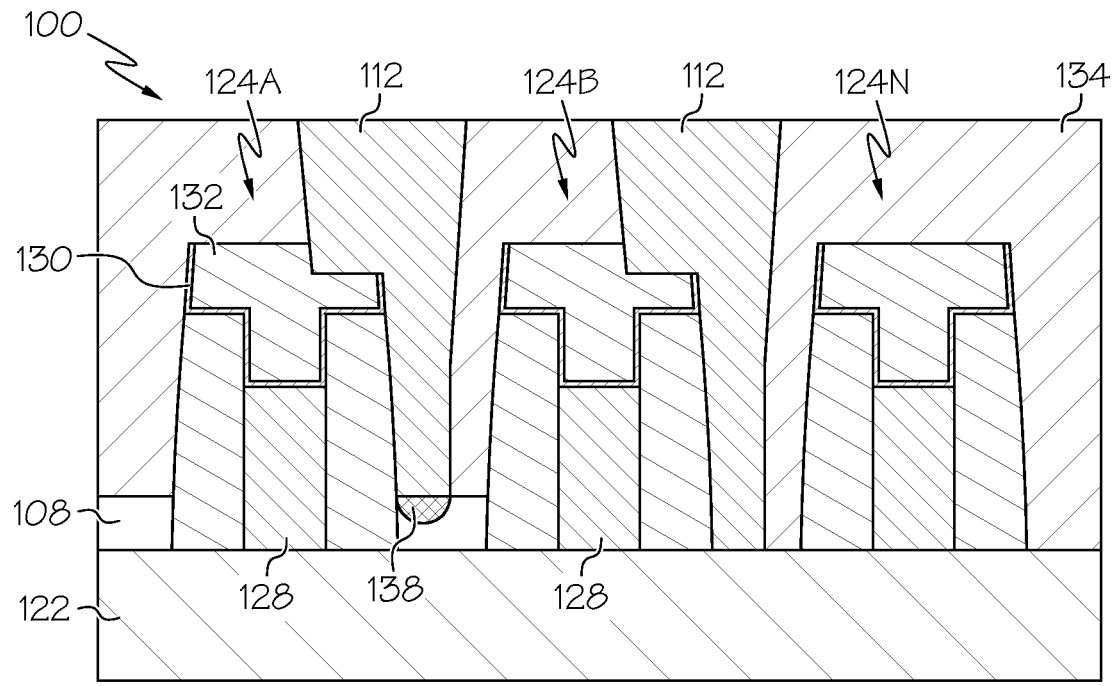
FIG. 6 shows a cross-sectional view of the device following formation of TS layer according to illustrative embodiments.

Next, as shown in FIG. 6, a dielectric layer (DL) 134 is formed over gate structures 124A-N. TS layer 112 is then formed as part of a self-aligned source/drain contact formation. As shown in this embodiment, TS layer 112 is formed adjacent gate structures 124A and 124B. TS layer 112 may be formed by one or more patterning and etching steps to form the necessary openings in DL 134. To accomplish this, a masking structure (not shown) may be first formed over DL 134, and an opening in the masking structure is then patterned, for example, using a photo-lithography processes or other lithographic process (e.g., electron beam lithography, imprint lithography, etc.). Also shown is a silicide 138 beneath a portion of TS layer 112 adjacent gate structure 124A.

Figure 7:
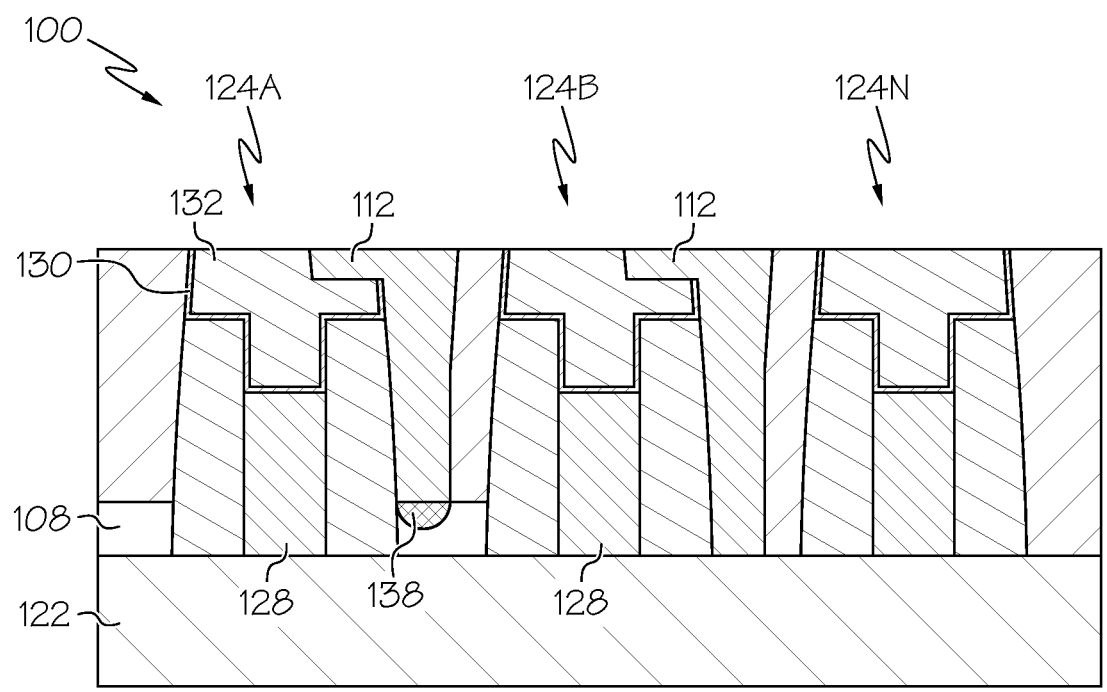
FIG. 7 shows a cross-sectional view of the device following a TS planarization according to illustrative embodiments.
Figure 8:
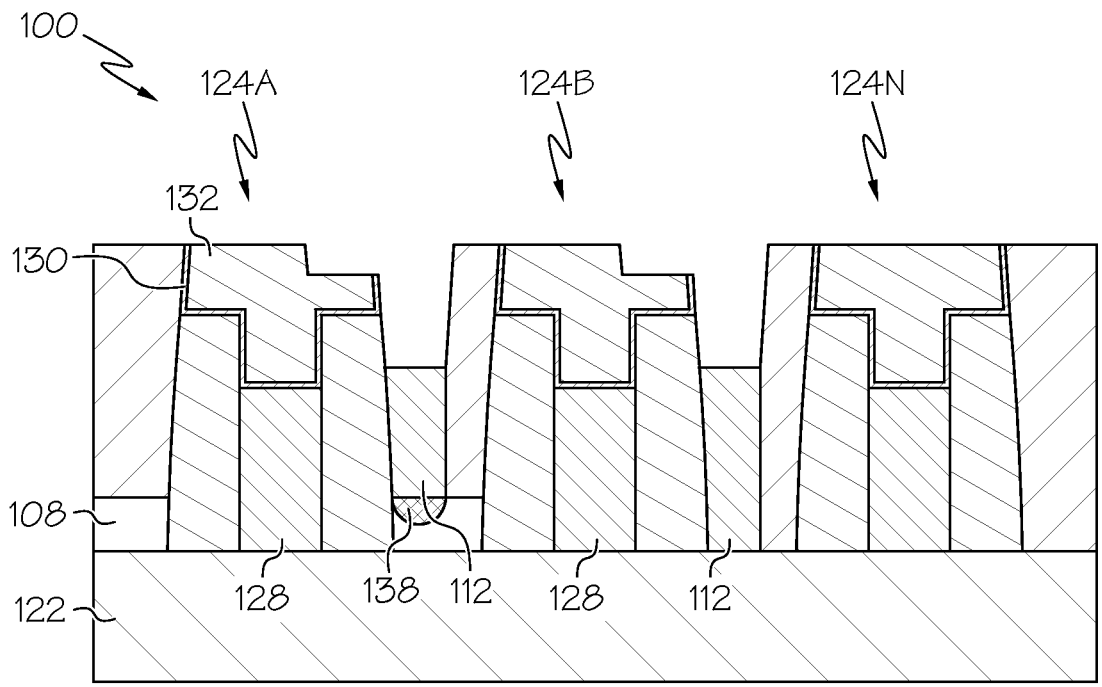
FIG. 8 shows a cross-sectional view of the device following formation of a set of recesses in the TS layer according to illustrative embodiments.
Figure 9:
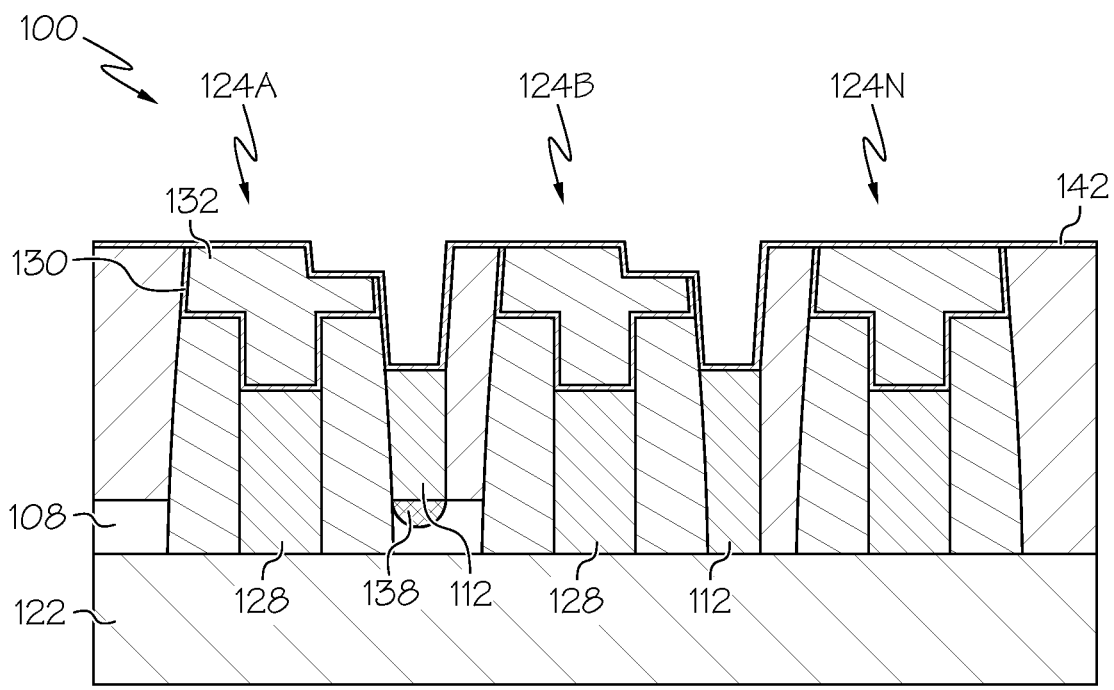
FIG. 9 shows a cross-sectional view of the device following deposition of a spacer protection layer according to illustrative embodiments.
Figure 10:
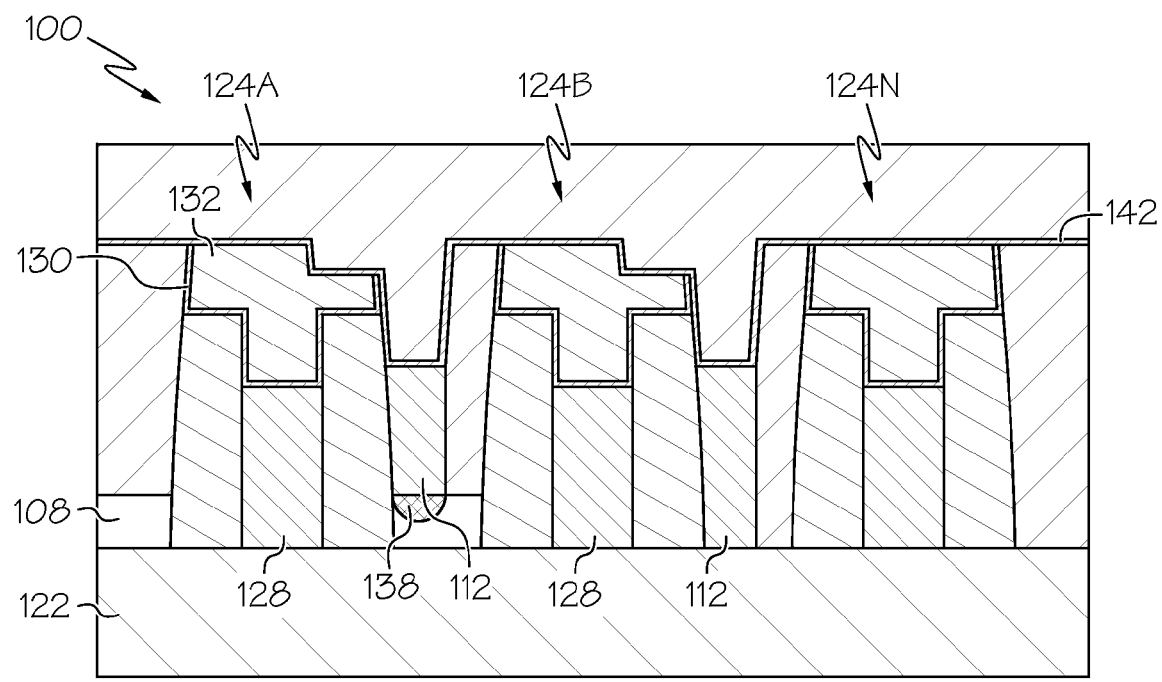
FIG. 10 shows a cross-sectional view of the device following deposition of oxide interlayer dielectric (ILD) according to illustrative embodiments.

Next, as shown in FIG. 7, DL 134 and TS layer 112 are partially removed, e.g., via CMP, and TS layer 112 is further removed as shown in FIG. 8. An optional etch stop layer (e.g. HfO2) 142 is then formed over gate structures 124A-N, as shown in FIG. 9, and an oxide interlayer dielectric (ILD) 144 is deposited over etch stop layer 142, as shown in FIG. 10.

Figure 11:
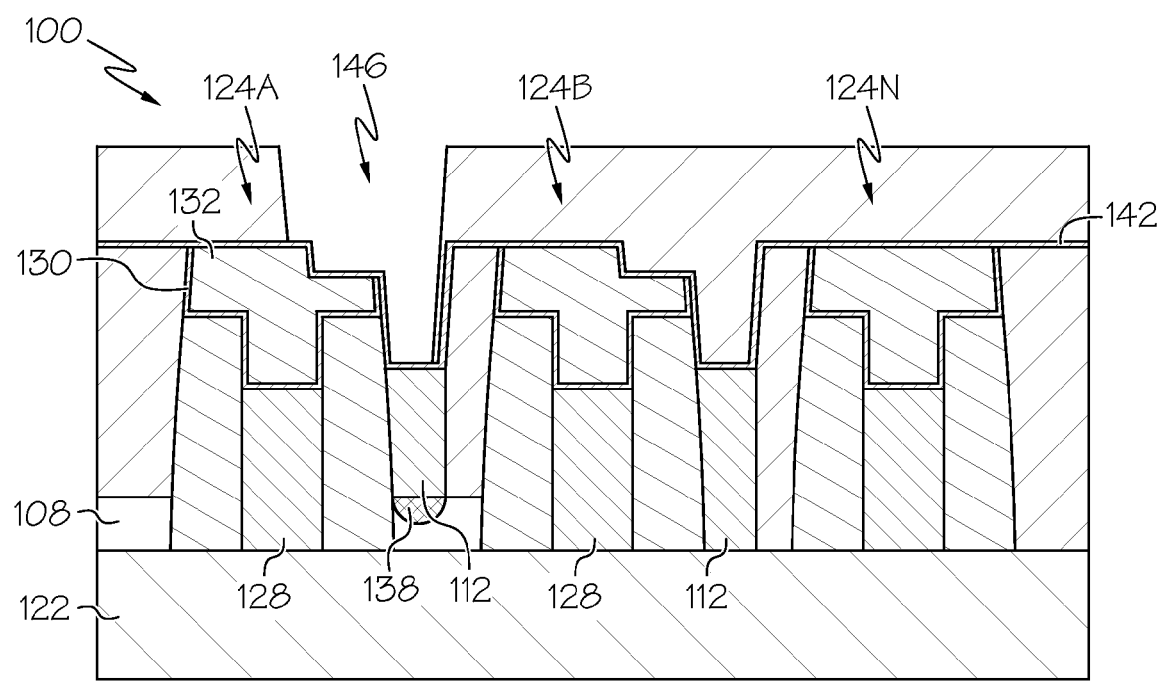
FIG. 11 shows a cross-sectional side view of the device following formation of an opening in ILD the according to illustrative embodiments.
Figure 12:
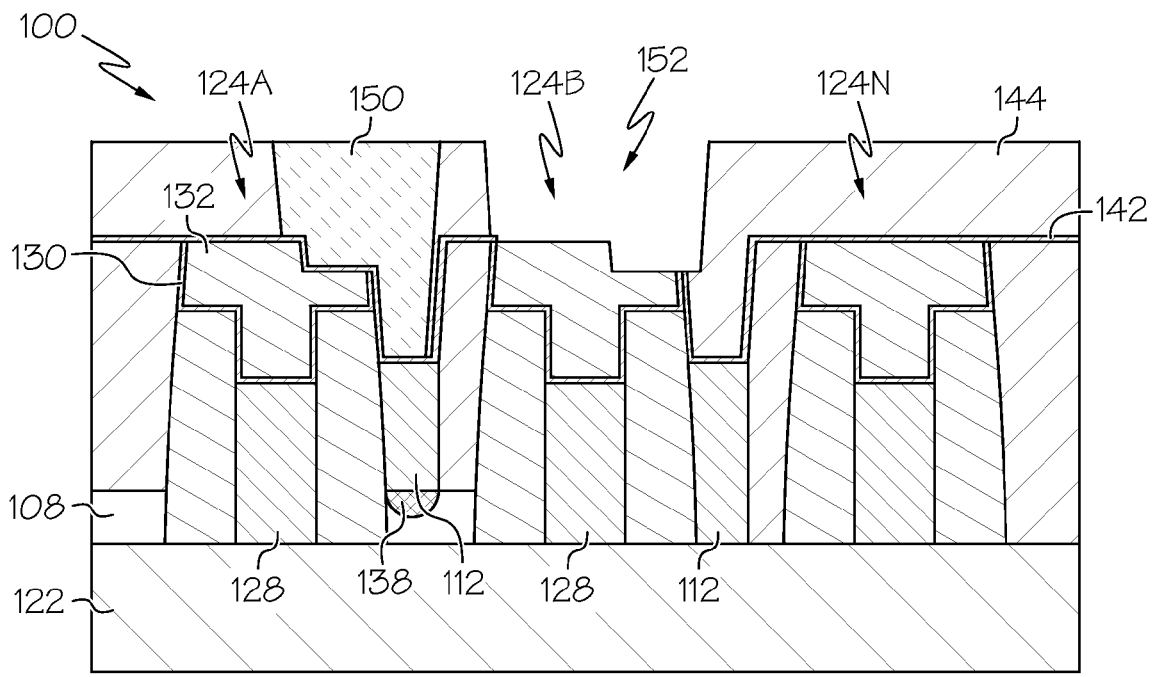
FIG. 12 shows a cross-sectional side view of the device following formation of an organic dielectric layer (ODL) and gate contact formation according to illustrative embodiments.
Figure 13:
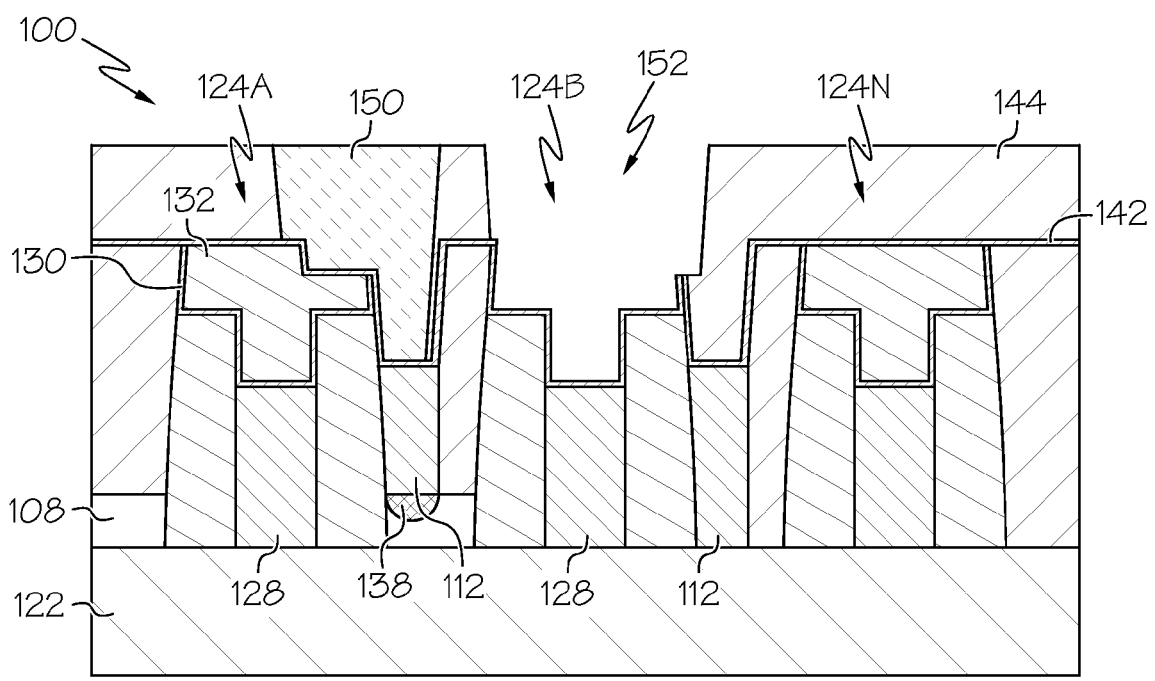
FIG. 13 shows a cross-sectional side view of the device following a gate contact etch according to illustrative embodiments.
Figure 14:
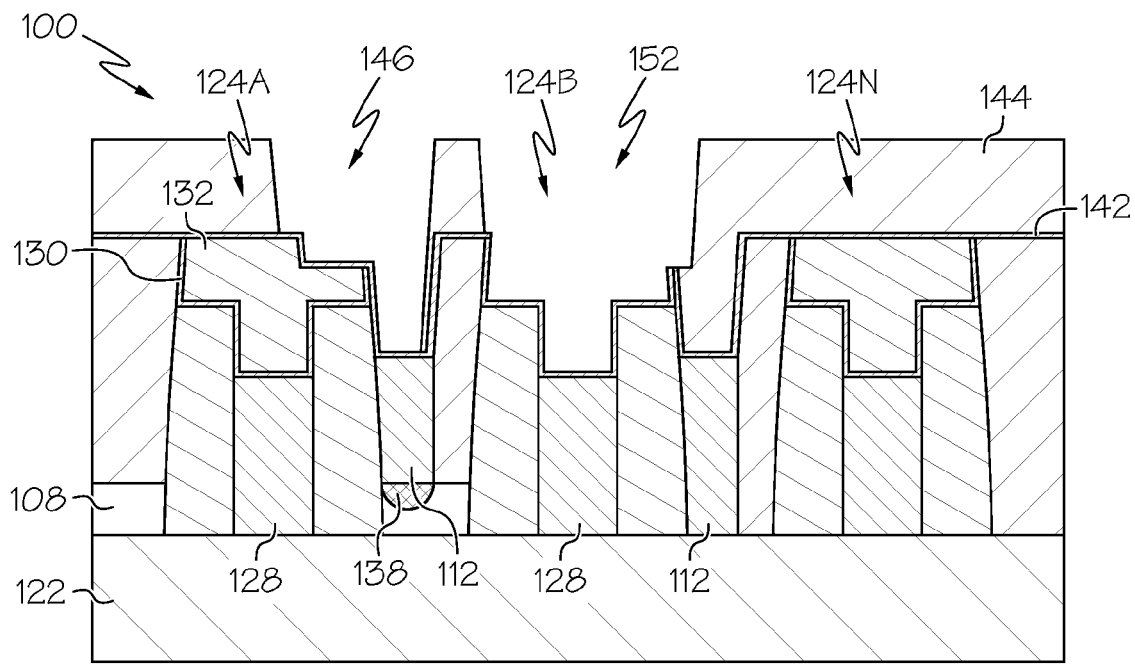
FIG. 14 shows a cross-sectional side view of the device following removal of the ODL according to illustrative embodiments.
Figure 15:
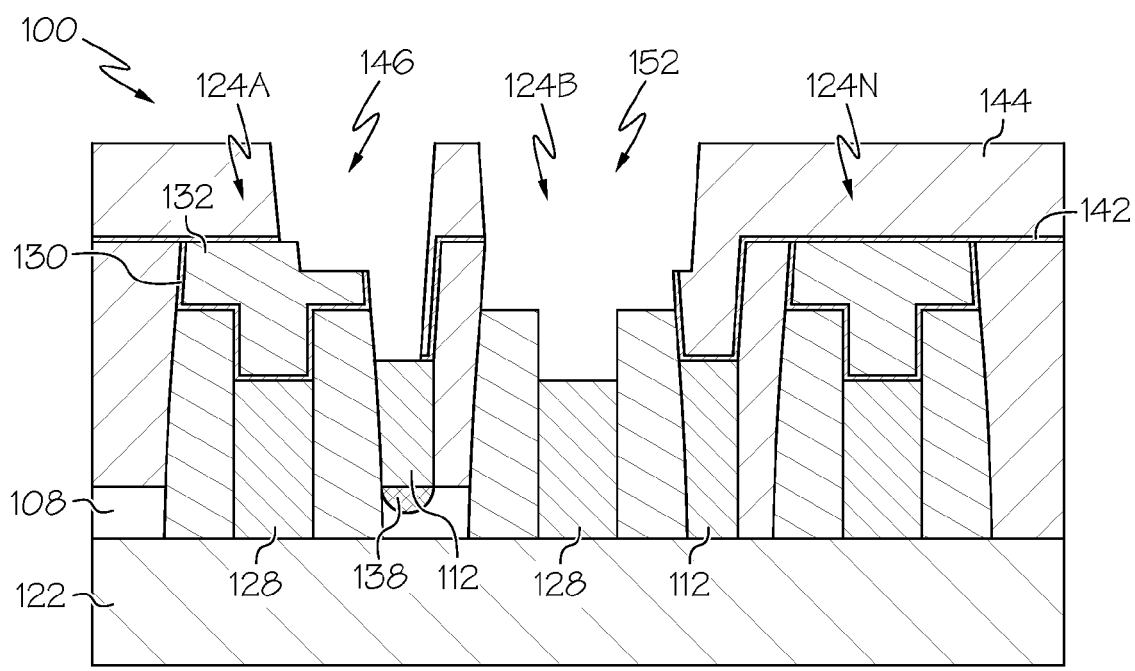
FIG. 15 shows a cross sectional side view of the device following removal of the spacer protection layer according to illustrative embodiments.
Figure 16:
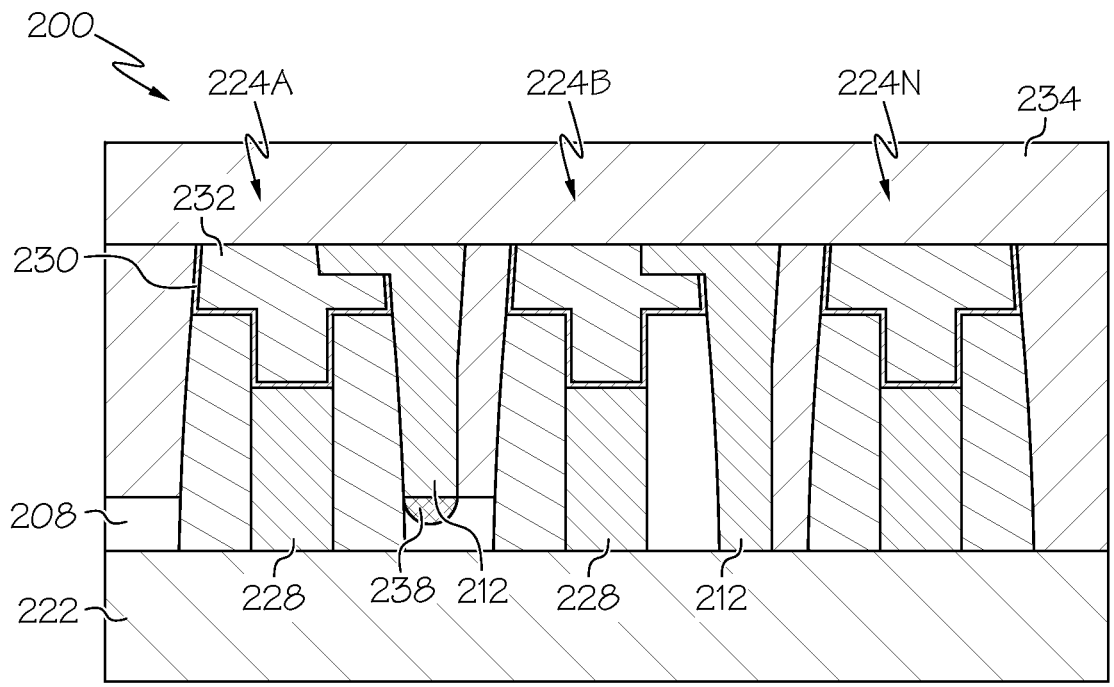
FIG. 16 shows a cross sectional side view of the device following formation of an ILD according to illustrative embodiments.

Next, a portion of ILD 144 is patterned and etched to form an opening 146 for the S/D contacts, as shown in FIG. 11. In this embodiment, ILD 144 is etched selective to etch stop layer 142. An organic dielectric layer (ODL) 150 is then formed within opening 146 for the S/D contact, and ILD 144 is patterned and etched to form an opening 152 for the gate contact, as shown in FIG. 12. Opening 152 is then extended downward by removing capping layer 132 from gate structure 124B, as shown in FIG. 13. The etch process is selective to etch stop layer 142 and spacer protection layer 130. Next, ODL 150 is removed from opening 146, as shown in FIG. 14, and etch stop layer 142 is removed from opening 146 and opening 152, as shown in FIG. 15. Finally, a metal material is deposited into openings 146 and 152, and planarized (e.g., via CMP) to form the resulting structure of device 100 shown in FIGS. 2A-2D.

Referring now to FIGS. 16-25, a process for forming contacts in device 200 (FIGS. 3A-D) according to another embodiment will be described. As shown in the side cross-sectional view of FIG. 16, device 200 includes a set of gate structures 224A-N (e.g., replacement metal gate structures) formed over substrate 222, which may have a planer or FIN structure. It will be appreciated that gate structure 224A is from cut A-A, gate structure 224B is from cut B-B, and gate structure 224N is from cut C-C, as shown in FIGS. 3A-3B. Although not shown in detail for the sake of brevity, gate structures 224A-N are opened (e.g., similar to that as shown in FIG. 4), and then filled with a recessed gate dielectric and metal gate stack 228 (e.g. HfO2 as dielectric and TiN/W as gate metal), a spacer protection layer 230 (e.g. HfO2) and a capping layer 232 (e.g., SiN). Similar to that as shown in FIG. 7, TS layer 212 is then formed as part of the self-aligned source/drain contact formation. As shown in this embodiment, TS layer 212 is formed adjacent gate structures 224A and 2248. Also shown is a silicide 238 beneath a portion of TS layer 212 adjacent gate structure 224A. A dielectric layer (DL) 234 is then formed over gate structures 224A-N.

Figure 17:
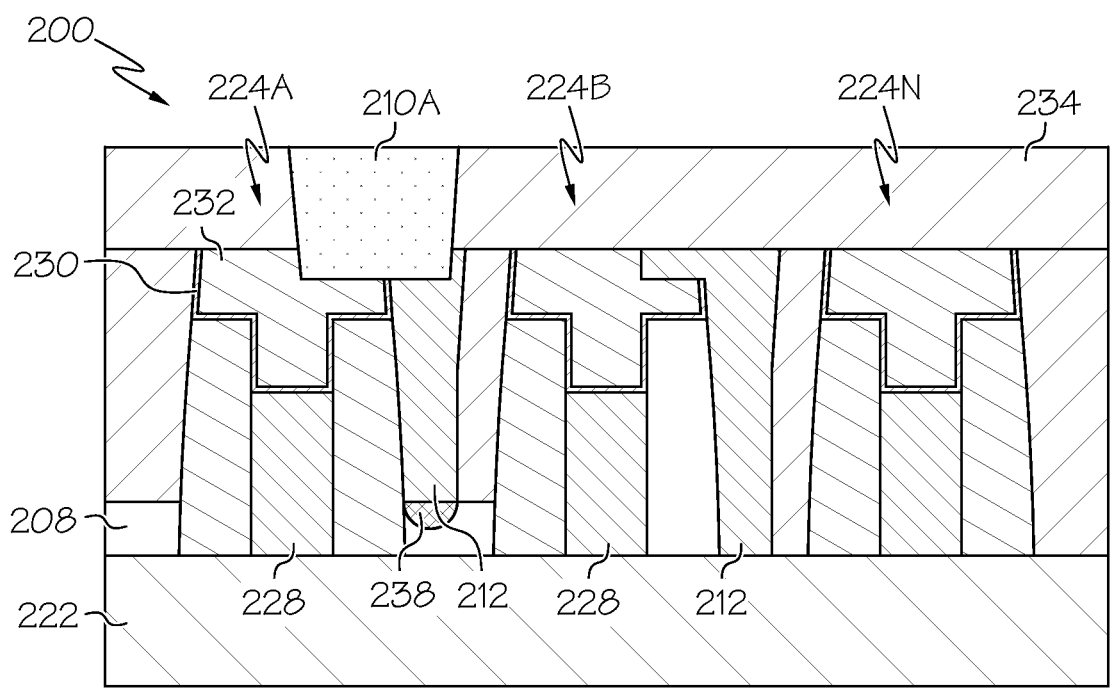
FIG. 17 shows a cross sectional side view of the device following S/D contact formation according to illustrative embodiments.
Figure 18:
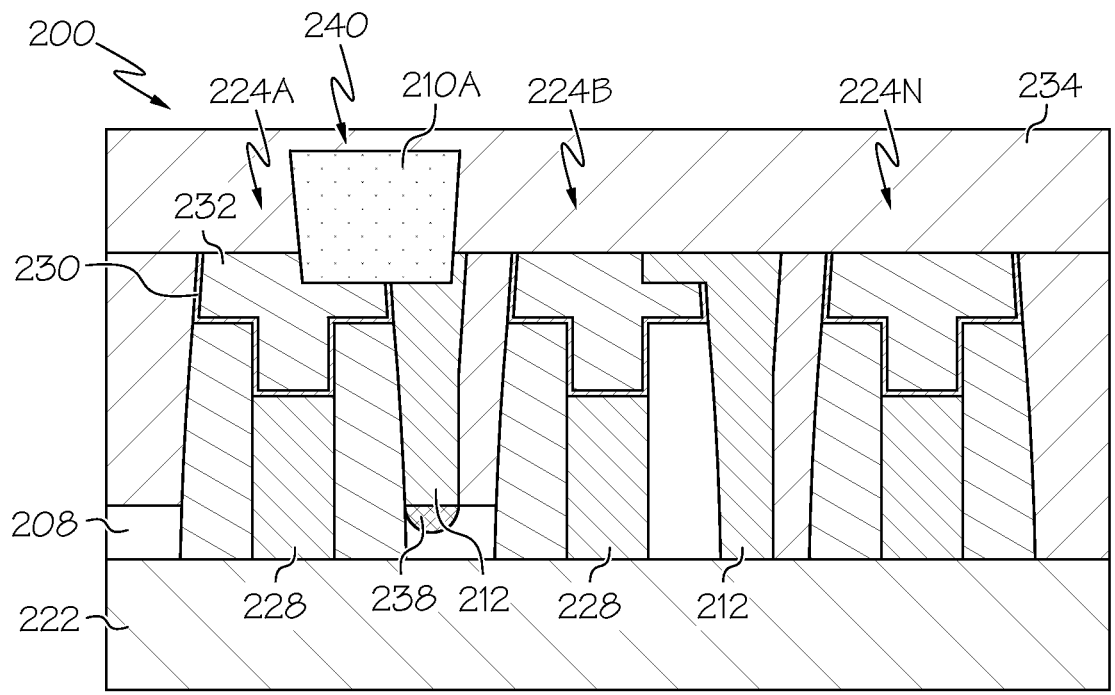
FIG. 18 shows a cross sectional side view of the device following formation of another ILD over the S/D contact according to illustrative embodiments.

Next, as shown in FIG. 17, an opening is created in DL 234, and a metal material is deposited therein to form S/D contact 210A. An additional IDL 240 is then formed over gate structures 224A-N, as shown in FIG. 18.

Figure 19:
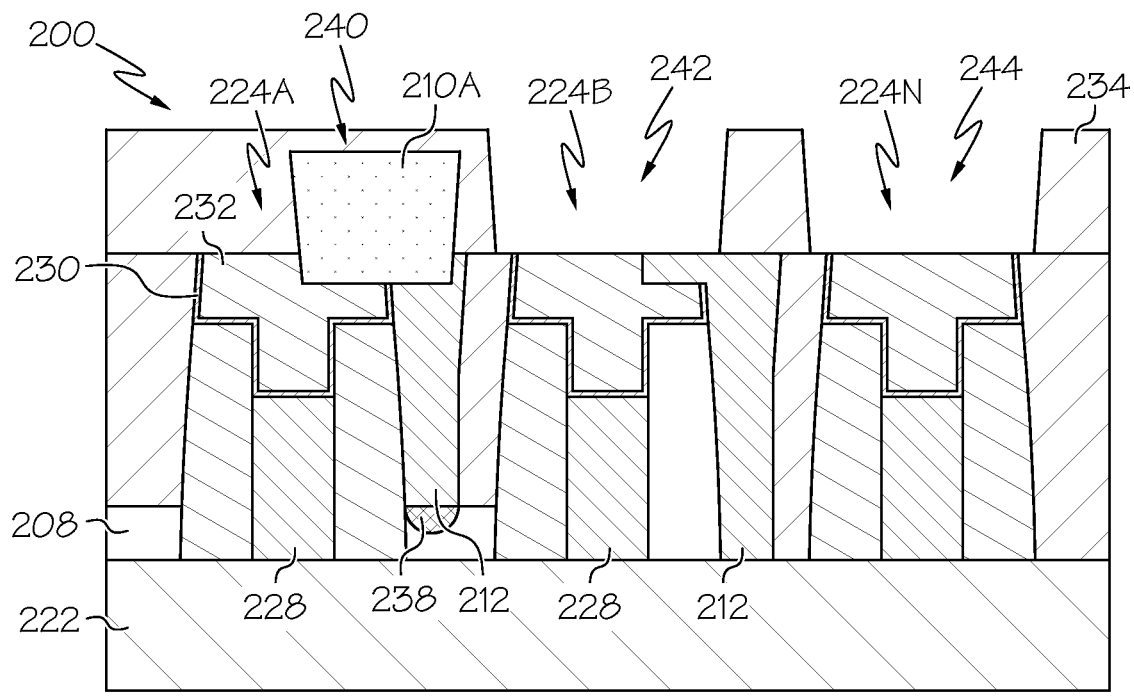
FIG. 19 shows a cross sectional side view of the device following formation of a set of openings in the ILD according to illustrative embodiments.

Next, as shown in FIG. 19, DL 234 and IDL 240 are patterned and etched (e.g., using a reactive ion etch process) to form openings 242 and 244 for the gate contacts. In this embodiment, etching is selective to TS layer 212 and capping layer 232. Here openings 242 and 244 are dimensioned so that the gate contacts have a larger critical dimension (CD) than the current process on record (e.g., approximately 10 nm larger).

Figure 20:
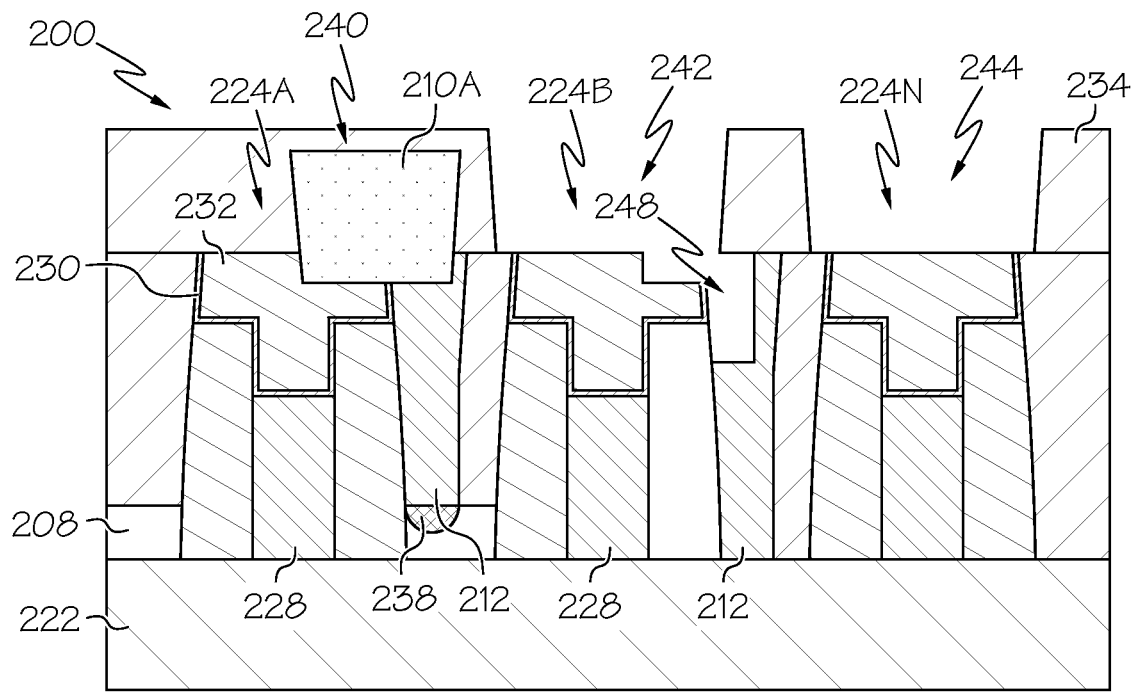
FIG. 20 shows a cross sectional side view of the device following removal of a portion of TS layer according to illustrative embodiments.
Figure 21:
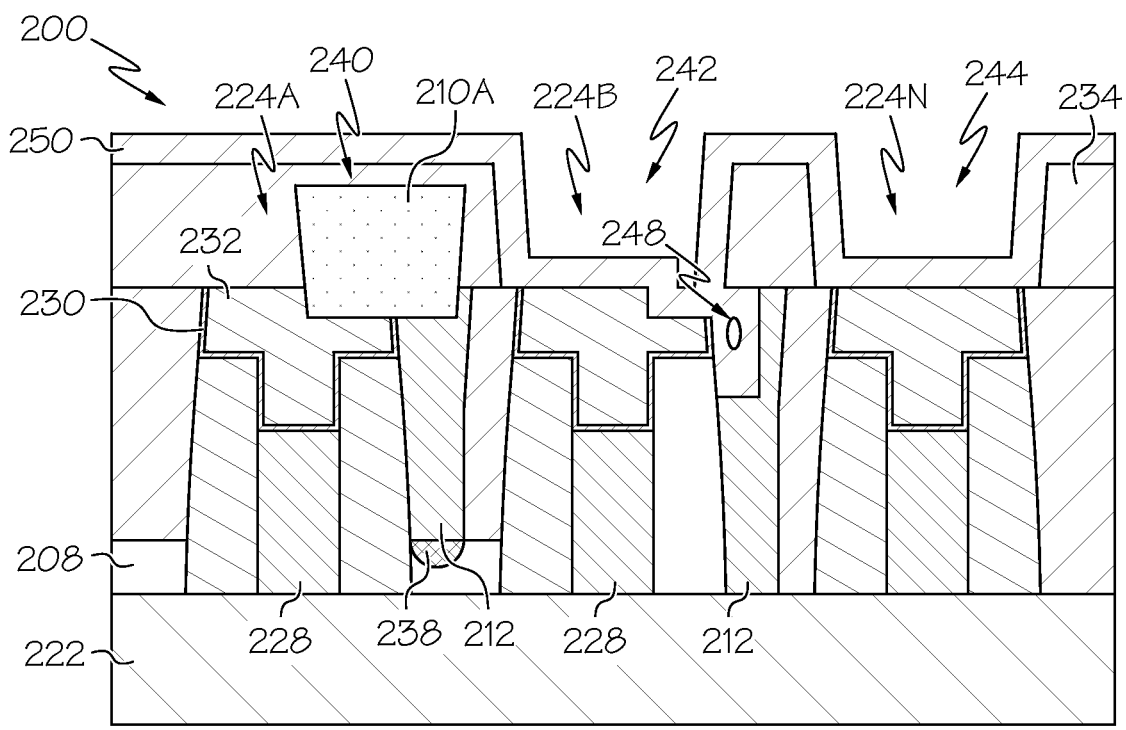
FIG. 21 shows a cross sectional side view of the device following formation of an atomic deposition layer oxide fill according to illustrative embodiments.
Figure 22:
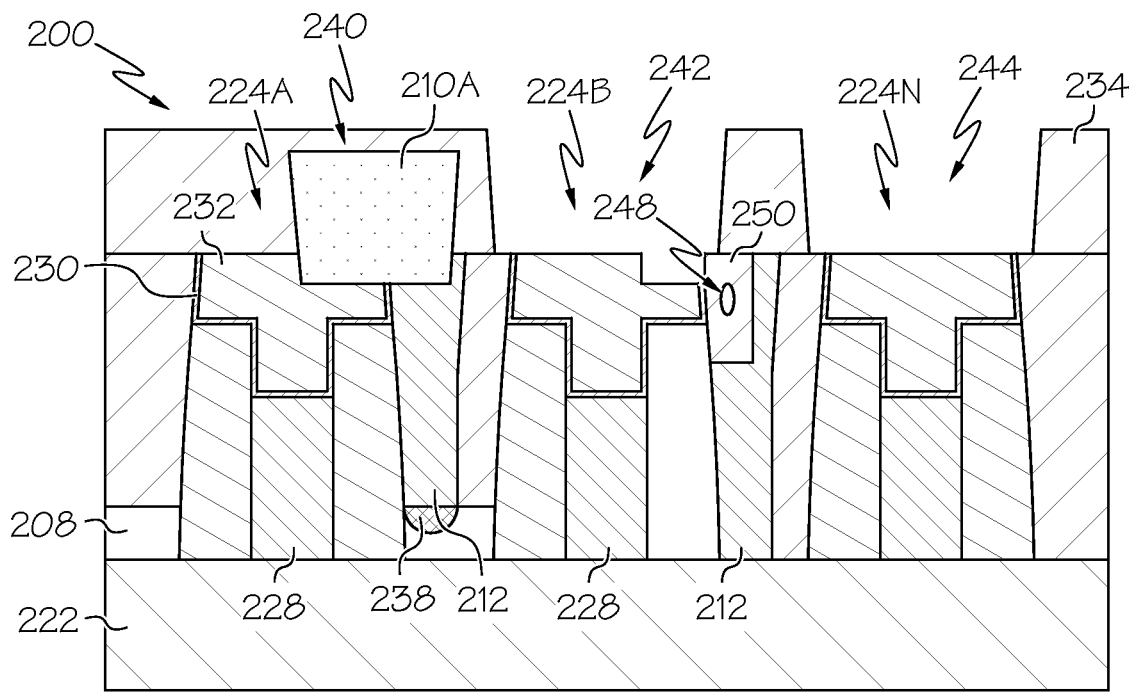
FIG. 22 shows a cross sectional side view of the device following removal of the atomic deposition layer oxide fill according to illustrative embodiments.
Figure 23:
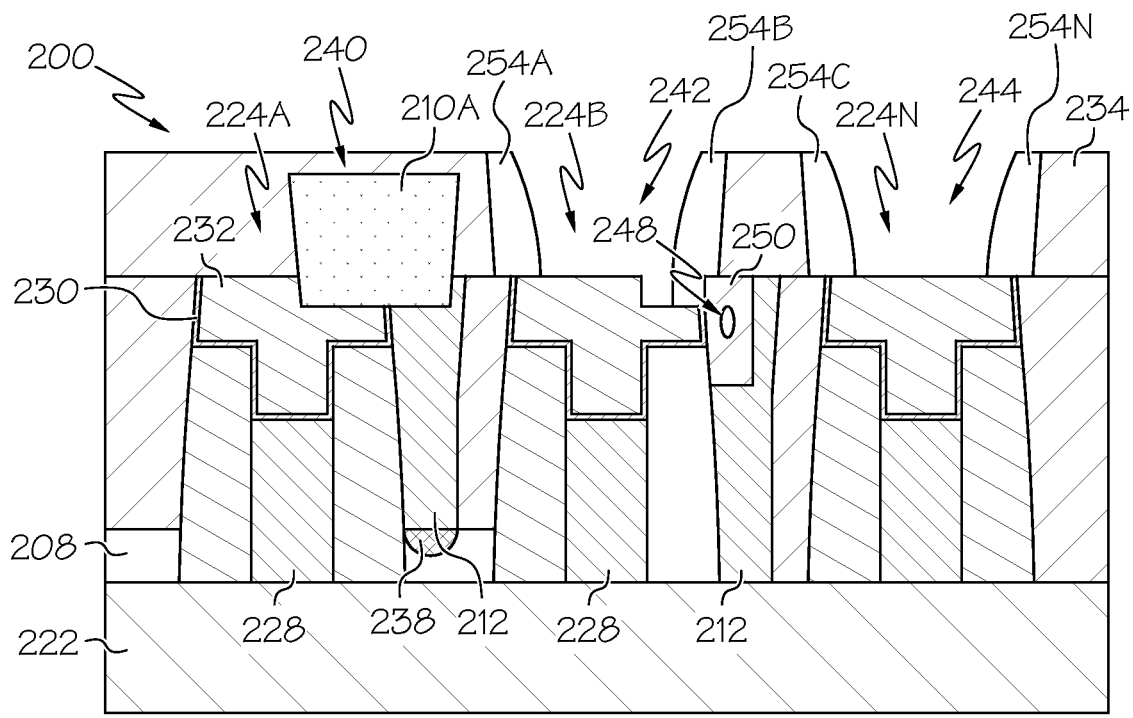
FIG. 23 shows a cross sectional side view of the device following a spacer formation according to illustrative embodiments.
Figure 24:
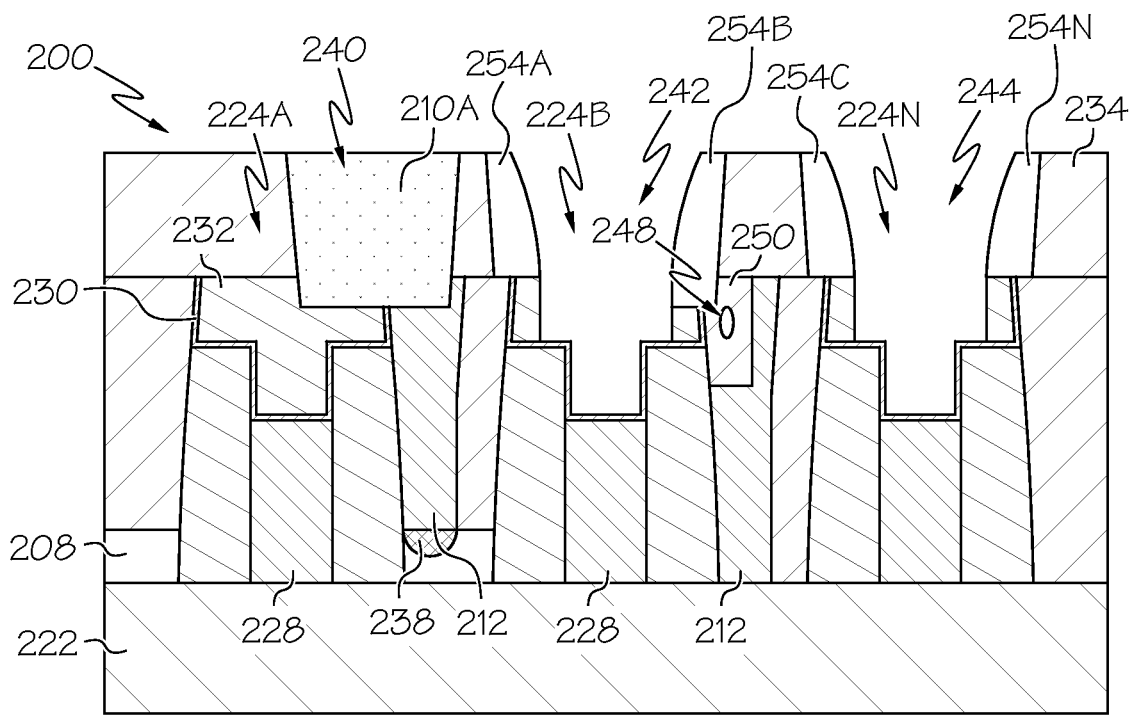
FIG. 24 shows a cross sectional side view of the device following removal of the capping layer according to illustrative embodiments.
Figure 25:
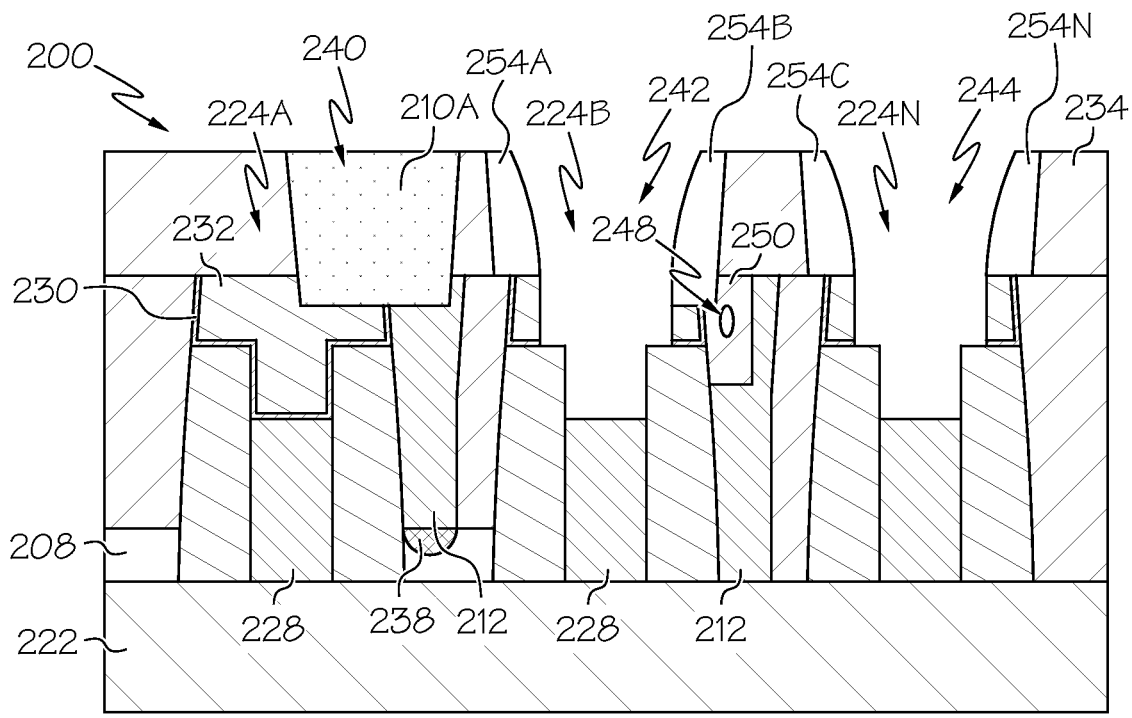
FIG. 25 shows a cross sectional side view of the device following removal of spacer protection layer according to illustrative embodiments.

A recess 248 is then formed within TS layer 212 adjacent gate structure 224B, as shown in FIG. 20. An atomic layer deposition (ALD) oxide fill 250 is then formed over gate structures 224A-N, as shown in FIG. 21, and isotropically etched back without removing a portion of ALD oxide fill 250 formed within recess 248 of TS layer 212, as shown in FIG. 22. Next, a set of spacers 254A-N are formed for the gate contacts, as shown in FIG. 23, and capping layer 232 and spacer protection layer 230 are removed within openings 242 and 244, as shown in FIG. 24 and FIG. 25, respectively. Finally, a metal material is deposited into openings 242 and 244, and planarized (e.g., via CMP) to form the resulting structure of device 200 shown in FIGS. 3A-3D.

As described, embodiments herein provide approaches for gate and source/drain contact formation in a semiconductor device. With these approaches, a more aggressive area scaling is achieved by positioning the gate contact closer to the active region. Specifically, as shown in the exemplary process flow of FIGS. 2A-2D and 4-15, because TS layer 112 is recessed, gate contact 124B won't short with TS 112 even though gate contact 124B overlaps with TS layer 112. Meanwhile, in the exemplary process flow of FIGS. 3A-3D and 16-25, selectively removing the shorted region and re-filling with oxide eliminates the gate contact 224B to TS layer 212 short even they are overlapped. As such, the deficiencies of the prior art are overcome, i.e., a gate contact to TS layer short is prevented while circuit area scaling is improved.

In various embodiments, design tools can be provided and configured to create the datasets used to pattern the semiconductor layers as described herein. For example data sets can be created to generate photomasks used during lithography operations to pattern the layers for structures as described herein. Such design tools can include a collection of one or more modules and can also be comprised of hardware, software or a combination thereof. Thus, for example, a tool can be a collection of one or more software modules, hardware modules, software/hardware modules or any combination or permutation thereof. As another example, a tool can be a computing device or other appliance on which software runs or in which hardware is implemented. As used herein, a module might be implemented utilizing any form of hardware, software, or a combination thereof. For example, one or more processors, controllers, ASICs, PLAs, logical components, software routines or other mechanisms might be implemented to make up a module. In implementation, the various modules described herein might be implemented as discrete modules or the functions and features described can be shared in part or in total among one or more modules. In other words, as would be apparent to one of ordinary skill in the art after reading this description, the various features and functionality described herein may be implemented in any given application and can be implemented in one or more separate or shared modules in various combinations and permutations. Even though various features or elements of functionality may be individually described or claimed as separate modules, one of ordinary skill in the art will understand that these features and functionality can be shared among one or more common software and hardware elements, and such description shall not require or imply that separate hardware or software components are used to implement such features or functionality.

It is apparent that there has been provided approaches for forming gate and S/D contacts in ultra-scaled devices. While the invention has been particularly shown and described in conjunction with exemplary embodiments, it will be appreciated that variations and modifications will occur to those skilled in the art. For example, although the illustrative embodiments are described herein as a series of acts or events, it will be appreciated that the present invention is not limited by the illustrated ordering of such acts or events unless specifically stated. Some acts may occur in different orders and/or concurrently with other acts or events apart from those illustrated and/or described herein, in accordance with the invention. In addition, not all illustrated steps may be required to implement a methodology in accordance with the present invention. Furthermore, the methods according to the present invention may be implemented in association with the formation and/or processing of structures illustrated and described herein as well as in association with other structures not illustrated. Therefore, it is to be understood that the appended claims are intended to cover all such modifications and changes that fall within the true spirit of the invention.

What is claimed is:

1. A method of forming a device, the method comprising:
   forming a gate transistor over a substrate;
   forming a source/drain (S/D) contact over a trench-silicide (TS) layer formed adjacent the gate transistor; and
   forming a gate contact over the gate transistor, wherein at least a portion of the gate contact is positioned over the TS layer.

2. The method according to claim 1, further comprising forming a set of fins in an active region over the substrate.

3. The method according to claim 1, further comprising forming a plurality of gate transistors over the substrate by:
   providing a set of gate structures;
   removing a metal layer to form a gate recess for each of the set of gate structures;
   forming a spacer protection layer over the set of gate structures;
   forming a capping layer over the set of gate structures;
   forming a dielectric layer over the capping layer; and
   removing the TS layer and the dielectric layer over the set of gate structures.

4. The method according to claim 3, the forming the plurality of gate transistors further comprising:
   forming a recess within the TS layer adjacent one or more of the set of gate structures;
   forming an interlayer dielectric (ILD) over the set of gate structures;
   etching the ILD to form an opening for the S/D contact;
   forming an organic dielectric layer (ODL) within the opening for the S/D contact;
   etching the ILD to form an opening for the gate contact;
   removing the ODL; and
   depositing a metal material over the set of gate structures.

5. The method according to claim 4, further comprising forming an etch stop layer over the set of gate structures following the formation of the recess within the TS layer adjacent one or more of the set of gate structures.

6. The method according to claim 3, the forming the plurality of gate transistors further comprising:
   forming an interlayer dielectric layer (IDL) over the set of gate structures;
   etching the IDL to form an opening for the S/D contact;
   depositing a metal material into the opening for the S/D contact to form the S/D contact;
   forming another IDL layer over the S/D contact;
   etching the ILD and the another IDL to form an opening for the gate contact;

forming a recess within the TS layer adjacent one of the set of gate structures;
forming an atomic layer deposition (ALD) oxide fill over the set of gate structures;
etching the ALD oxide fill over the set of gate structures without removing a portion of the ALD oxide fill formed within the recess within the TS layer;
forming a set of spacers for the gate contact;
removing the capping layer formed within the opening for the gate contact; and
depositing a metal layer over the set of gate structures.

7. The method according to claim 1, wherein the TS layer is one of: entirely recessed beneath the S/D contact, and partially recessed beneath the S/D contact below the portion of the gate contact positioned over the TS layer.

8. The method according to claim 1, further comprising forming a source-trench isolation region over the substrate.

9. A method for forming contacts in an ultra-scaled semiconductor device, the method comprising:
forming a gate transistor over a substrate;
forming a source/drain (S/D) contact over a trench-silicide (TS) layer formed adjacent the gate transistor; and
forming a gate contact over the gate transistor, wherein at least a portion of the gate contact is aligned over the TS layer.

10. The method according to claim 9, further comprising forming a set of fins in an active region over the substrate.

11. The method according to claim 9, further comprising forming a plurality of gate transistors over the substrate by:
providing a set of gate structures;
removing a metal layer to form a gate recess for each of the set of gate structures;
forming a spacer protection layer over the set of gate structures;
forming a capping layer over the set of gate structures;
forming a dielectric layer over the capping layer; and
removing the TS layer and the dielectric layer over the set of gate structures.

12. The method according to claim 11, the forming the plurality of gate transistors further comprising:
forming a recess within the TS layer adjacent one or more of the set of gate structures;
forming an interlayer dielectric (ILD) over the set of gate structures;
etching the ILD to form an opening for the S/D contact;
forming an organic dielectric layer (ODL) within the opening for the S/D contact;
etching the ILD to form an opening for the gate contact;
removing the ODL; and
depositing a metal material over the set of gate structures.

13. The method according to claim 12, further comprising forming an etch stop layer over the set of gate structures following the formation of the recess within the TS layer adjacent one or more of the set of gate structures.

14. The method according to claim 11, the forming the plurality of gate transistors further comprising:
forming an interlayer dielectric layer (IDL) over the set of gate structures;
etching the IDL to form an opening for the S/D contact;
depositing a metal material into the opening for the S/D contact to form the S/D contact;
forming another IDL layer over the S/D contact;
etching the ILD and the another IDL to form an opening for the gate contact;
forming a recess within the TS layer adjacent one of the set of gate structures;
forming an atomic layer deposition (ALD) oxide fill over the set of gate structures;
etching the ALD oxide fill over the set of gate structures without removing a portion of the ALD oxide fill formed within the recess within the TS layer;
forming a set of spacers for the gate contact;
removing the capping layer formed within the opening for the gate contact; and
depositing a metal layer over the set of gate structures.

15. The method according to claim 9, wherein the TS layer is one of: entirely recessed beneath the S/D contact, and partially recessed beneath the S/D contact below the portion of the gate contact positioned over the TS layer.

16. The method according to claim 9, further comprising forming a source-trench isolation region over the substrate.

17. A semiconductor device comprising:
a replacement metal gate (RMG) transistor formed over a substrate;
a source/drain (S/D) contact formed over a trench-silicide (TS) layer and positioned adjacent the gate transistor; and
a gate contact formed over the RMG transistor, wherein at least a portion of the gate contact is vertically aligned over the TS layer.

18. The device according to claim 17, further comprising a plurality of RMG transistors formed over the substrate, the plurality of RMG transistors including:
a set of gate structures formed over a substrate;
a metal layer within a gate recess of each of the set of gate structures; and
an interlayer dielectric formed over the set of gate structures.

19. The device according to claim 18, the plurality of gate transistors further comprising:
a recess within the TS layer adjacent one of the set of gate structures;
an atomic layer deposition (ALD) oxide fill within the recess; and
a set of spacers for the gate contact.

20. The device according to claim 17, wherein the TS layer is one of: entirely recessed beneath the S/D contact, and partially recessed beneath the S/D contact below the portion of the gate contact positioned over the TS layer.

* * * * *